US012289545B2

(12) United States Patent
Lee

(10) Patent No.: US 12,289,545 B2
(45) Date of Patent: Apr. 29, 2025

(54) IMAGE SENSING DEVICE INCLUDING LIGHT SHIELDING PATTERN

(71) Applicant: SK hynix Inc., Icheon-si (KR)

(72) Inventor: Kilbock Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/330,239

(22) Filed: Jun. 6, 2023

(65) Prior Publication Data

US 2023/0319435 A1 Oct. 5, 2023

Related U.S. Application Data

(63) Continuation of application No. 17/324,427, filed on May 19, 2021, now Pat. No. 11,671,723.

(30) Foreign Application Priority Data

Jan. 21, 2021 (KR) ........................ 10-2021-0008717

(51) Int. Cl.
*H04N 25/704* (2023.01)
*H01L 27/146* (2006.01)
(Continued)

(52) U.S. Cl.
CPC ..... *H04N 25/704* (2023.01); *H01L 27/14623* (2013.01); *H01L 27/14643* (2013.01); *H04N 23/672* (2023.01); *H04N 25/77* (2023.01)

(58) Field of Classification Search
CPC .... H04N 25/704; H04N 23/672; H04N 25/77; H04N 25/134; H04N 25/70; H04N 25/76;
(Continued)

(56) References Cited

U.S. PATENT DOCUMENTS

2016/0173857 A1* 6/2016 Yamazaki ............ H04N 13/257
2018/0166487 A1 6/2018 Noudo
(Continued)

FOREIGN PATENT DOCUMENTS

CN 204761572 U 11/2015
KR 20160016466 A 2/2016
(Continued)

OTHER PUBLICATIONS

First Office Action mailed on Jul. 15, 2024 for CN Appl. 202110962543.1, 21 pages with English translation.
(Continued)

*Primary Examiner* — Gevell V Selby
(74) *Attorney, Agent, or Firm* — Perkins Coie LLP

(57) ABSTRACT

Image sensing devices are disclosed. In some implementations, an image sensing device includes a substrate, and a pixel array including one or more phase difference detection pixel groups supported by the substrate and structured to respond to incident light, each phase difference detection pixel group including two or more phase difference detection pixels structured to detect a phase difference of the incident light, wherein the phase difference detection pixel group comprises a light shielding pattern structured to provide each of the two or more phase difference detection pixels with a light receiving region along two contiguous sides of each of the two or more phase difference detection pixels.

18 Claims, 8 Drawing Sheets

(51) Int. Cl.
*H04N 23/67* (2023.01)
*H04N 25/77* (2023.01)

(58) Field of Classification Search
CPC ......... H01L 27/14623; H01L 27/14643; H01L 27/14609; H01L 27/14607; H01L 27/14621; H01L 27/14627
See application file for complete search history.

(56) References Cited

U.S. PATENT DOCUMENTS

| | | |
|---|---|---|
| 2019/0148425 A1 | 5/2019 | Okuno et al. |
| 2019/0222738 A1 | 7/2019 | Galor Gluskin |
| 2020/0251513 A1 | 8/2020 | Noudo |
| 2020/0273898 A1 | 8/2020 | Tayanaka |
| 2020/0374475 A1 | 11/2020 | Fukuoka |
| 2021/0144321 A1* | 5/2021 | Yamashita ........... H04N 25/772 |

FOREIGN PATENT DOCUMENTS

| | | |
|---|---|---|
| KR | 10-2016-0031462 A | 3/2016 |
| KR | 10-2018-0015134 A | 2/2018 |

OTHER PUBLICATIONS

First Office Action mailed on Feb. 28, 2025 for KR Appl. 10-2021-0008717, 14 pages with English translation.

\* cited by examiner

IMAGE SENSING DEVICE INCLUDING LIGHT SHIELDING PATTERN

CROSS-REFERENCES TO RELATED APPLICATION

This patent document is a continuation of, and claims the priority and benefits of, U.S. patent application Ser. No. 17/324,427, filed on May 19, 2021, which claims the priority and benefits of Korean patent application number 10-2021-0008717, filed on Jan. 21, 2021. The contents of the above applications are incorporated by reference in their entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. The recent development of computer and communication industries is leading to an increase in demand for higher-performance image sensing devices in various devices such as smart phones, digital cameras, camcorders, personal communication systems (PSCs), game consoles, security cameras, medical micro cameras, robots, and infrared sensing devices.

CMOS image sensing devices have advantages over other types of image sensors in terms of how image sensing signals are processed. In addition, CMOS image sensing devices are fabricated using the CMOS fabrication technology, and thus CMOS image sensors and other signal processing circuitry can be integrated into a single chip, enabling the production of miniaturized CMOS image sensing devices, low power consumption image sensors at a lower cost.

SUMMARY

The embodiments of the disclosed technology relate to image sensing devices that can concurrently perform phase-difference detection autofocus (PDAF) and a one-shot high dynamic range (HDR) imaging by using pixel signals generated by a plurality of unit pixels included in one pixel group.

In an embodiment, an image sensing device is disclosed. The image sensing device includes a substrate, a pixel array including one or more phase difference detection pixel groups supported by the substrate and structured to respond to incident light, each phase difference detection pixel group including two or more phase difference detection pixels structured to detect a phase difference of the incident light, wherein the phase difference detection pixel group comprises a light shielding pattern structured to provide each of the two or more phase difference detection pixels with a light receiving region along two contiguous sides of each of the two or more phase difference detection pixels.

In another embodiment, an image sensing device is disclosed. The image sensing device includes a substrate, and a pixel array including one or more phase difference detection pixel groups supported by the substrate and structured to respond to incident light, each phase difference detection pixel group including first, second, third and fourth phase difference detection pixels arranged in a 2×2 matrix, wherein the phase difference detection pixel group comprises a light shielding pattern and first to fourth light receiving regions, and wherein the light shielding pattern is arranged at a center of the phase difference detection pixel group to shield at least part of phase difference detection pixel group structured to provide the first to fourth phase difference detection pixels with a first light receiving region, a second light receiving region, a third light receiving region and a fourth light receiving region, respectively, each of which has an L-shape.

In another embodiment, an image sensing device is disclosed. The image sensing device includes a substrate, and a pixel array having one or more phase difference pixel groups supported by the substrate and structured to respond to incident light, each phase difference detection pixel group including first to ninth phase difference detection pixels arranged in a 3×3 matrix and including photoelectric conversion elements, respectively, wherein the phase difference detection pixel group comprises a light shielding pattern structured to provide a first light receiving region, a third light receiving region, a seventh light receiving region and a ninth light receiving region, each of which has an L-shape, to the first, third, seventh and ninth phase difference detection pixels, respectively, which are located at four corners of the phase difference detection pixel group.

In another embodiment, an image sensing device is disclosed. The image sensing device includes a pixel array including one or more phase difference detection pixel groups, each of which is constituted by a plurality of phase difference detection pixels each including a photoelectric conversion element, wherein the phase difference detection pixel group includes a light shielding pattern configured to provide each of two or more phase difference detection pixels with a light receiving region having a bracket-type planar shape.

In another embodiment, an image sensing device is disclosed. The image sensing device includes a pixel array including one or more phase difference detection pixel groups each having a first phase difference detection pixel, a second phase difference detection pixel, a third phase difference detection pixel and a fourth phase difference detection pixel, which are arranged in a 2×2 matrix and include photoelectric conversion elements, respectively, wherein the phase difference detection pixel group includes a light shielding pattern arranged in the center thereof, and configured to provide the first to fourth phase difference detection pixels with a first light receiving region, a second light receiving region, a third light receiving region and a fourth light receiving region, respectively, each of which has a bracket-type planar shape.

In another embodiment, an image sensing device is disclosed. The image sensing device includes a pixel array having one or more phase difference pixel groups each including a first phase difference detection pixel, a second phase difference detection pixel, a third phase difference detection pixel, a fourth phase difference detection pixel, a fifth phase difference detection pixel, a sixth phase difference detection pixel, a seventh phase difference detection pixel, an eighth phase difference detection pixel and a ninth phase difference detection pixel, which are arranged in a 3×3 matrix and include photoelectric conversion elements, respectively, wherein the phase difference detection pixel group includes a light shielding pattern configured to provide a first light receiving region, a third light receiving region, a seventh light receiving region and a ninth light receiving region, which each have a bracket-type planar shape, to the first, third, seventh and ninth phase difference detection pixels, respectively, which are located in the respective corners of the phase difference detection pixel group.

In some embodiments of the disclosed technology, each of two or more unit pixels among the plurality of unit pixels included in one pixel group may include the light receiving regions each having a bracket-type planar shape due to the light shielding pattern. Thus, the image sensing device may perform an operation on pixel signals generated by one pixel group, thereby performing the PDAF function and the one-shot HDR imaging function in the horizontal, vertical and diagonal directions at the same time.

In another embodiment, an image sensing device is disclosed. The image sensing device includes a substrate, and a pixel array including a plurality of imaging pixel groups and one or more phase difference detection pixel groups supported by the substrate and structured to respond to incident light, each imaging pixel group including one or more imaging pixels structured to convert the incident light into an optical image, each phase difference detection pixel group including two or more phase difference detection pixels structured to detect a phase difference of the incident light, wherein the phase difference detection pixel group comprises a light shielding pattern structured to provide each of the two or more phase difference detection pixels with a light receiving region along two sides of each of the two or more phase difference detection pixels.

In another embodiment, an image sensing device is disclosed. The image sensing device includes a substrate, and a pixel array including a plurality of imaging pixel groups and one or more phase difference detection pixel groups supported by the substrate and structured to respond to incident light, each imaging pixel group including one or more imaging pixels structured to convert the incident light into an optical image, each phase difference detection pixel group including first, second, third and fourth phase difference detection pixels arranged in a 2×2 matrix, wherein the phase difference detection pixel group comprises a light shielding pattern and first to fourth light receiving regions, and wherein the light shielding pattern is arranged at a center of the phase difference detection pixel group to shield at least part of phase difference detection pixel group structured to provide the first to fourth phase difference detection pixels with a first light receiving region, a second light receiving region, a third light receiving region and a fourth light receiving region, respectively, each of which has an L shape.

In another embodiment, an image sensing device is disclosed. The image sensing device includes a substrate, and a pixel array having a plurality of imaging pixel groups and one or more phase difference pixel groups supported by the substrate and structured to respond to incident light, each imaging pixel group including one or more imaging pixels structured to convert the incident light into an optical image, each phase difference detection pixel group including first to ninth phase difference detection pixels arranged in a 3×3 matrix and including photoelectric conversion elements, respectively, wherein the phase difference detection pixel group comprises a light shielding pattern structured to provide a first light receiving region, a third light receiving region, a seventh light receiving region and a ninth light receiving region, each of which has an L shape, to the first, third, seventh and ninth phase difference detection pixels, respectively, which are located at four corners of the phase difference detection pixel group.

In some embodiments, an image sensing device includes a substrate, and a pixel array having one or more phase difference pixel groups supported by the substrate and structured to respond to incident light, each phase difference detection pixel group including first to ninth phase difference detection pixels arranged in a 3×3 matrix and including photoelectric conversion elements, respectively, wherein the phase difference detection pixel group comprises a light shielding pattern structured to provide a first light receiving region, a third light receiving region, a seventh light receiving region and a ninth light receiving region, each of which has an L-shape, to the first, third, seventh and ninth phase difference detection pixels, respectively, which are located at four corners of the phase difference detection pixel group.

In one example, the first, third, seventh and ninth phase difference detection pixels generate pixel signals in response to incident light rays at the same wavelength band.

In another example, the first, third, seventh and ninth light receiving regions are symmetrical with one another and have substantially the same light receiving area.

In another example, the light shielding pattern includes a second light receiving region, a fourth light receiving region, a sixth light receiving region and an eighth light receiving region, each of which has a linear region, corresponding to the second, fourth, sixth and eighth phase difference detection pixels, respectively, which are located between the first and third phase difference detection pixels, between the third and seventh phase difference detection pixels, between the seventh and ninth phase difference detection pixels, and between the ninth and first phase difference detection pixels, respectively, in the phase difference detection pixel group.

In another example, the second and eighth light receiving regions facing each other in one direction are symmetrical with each other and have substantially the same light receiving area, and the fourth and sixth light receiving regions facing each other in another direction are symmetrical with each other and have substantially the same light receiving area.

In another example, the second, fourth, sixth and eighth phase difference detection pixels generate pixel signals in response to incident light rays at the same wavelength band.

In another example, the second and eighth phase difference detection pixels facing in one direction generate pixel signals in response to incident light rays at a first wavelength band, and the fourth and sixth phase difference detection pixels facing each other in another direction generate pixel signals in response to incident light rays at a second wavelength band.

In another example, the light shielding pattern is formed as a single pattern structured to overlap portions of the photoelectric conversion elements of the first to fourth phase difference detection pixels and the sixth to ninth phase difference detection pixels along the edge of the fifth phase difference detection pixel located at a center of the phase difference detection pixel group.

DETAILED DESCRIPTION

Features of the technology disclosed in this patent document are described by examples of an image sensing device with reference to the accompanying drawings.

Phase-difference detection autofocus (PDAF) is an autofocus scheme that is used to automatically adjust a focus using a phase difference between detected images. One-shot high dynamic range (HDR) imaging is a scheme that can create an HDR image through a single imaging operation.

The disclosed technology can be implemented in some embodiments to provide an image sensing device with one or more pixels that can perform both PDAF and one-shot HDR imaging.

In some implementations, the image sensing device can perform the PDAF and the one-shot HDR imaging concurrently by using pixel signals generated by a pixel group including a plurality of unit pixels.

In some implementations, a pixel array of the image sensing device may include one or more pixel groups each including a plurality of unit pixels. At least one of the one or more pixel groups may include a light shielding pattern and one or more light receiving regions. The light shielding pattern may be structured to shield at least part of the one or more phase difference detection pixels from light. The one or more light receiving regions may be structured to allow a limited amount of light to pass through and enter the one or more phase difference detection pixels. In one example, each pixel group may provide a light shielding pattern and a light receiving region for two or more unit pixels in the pixel group. The light receiving region may include an L-shaped structure. In some implementations, the light receiving region may include a plurality of L-shaped opening.

Figure 1:
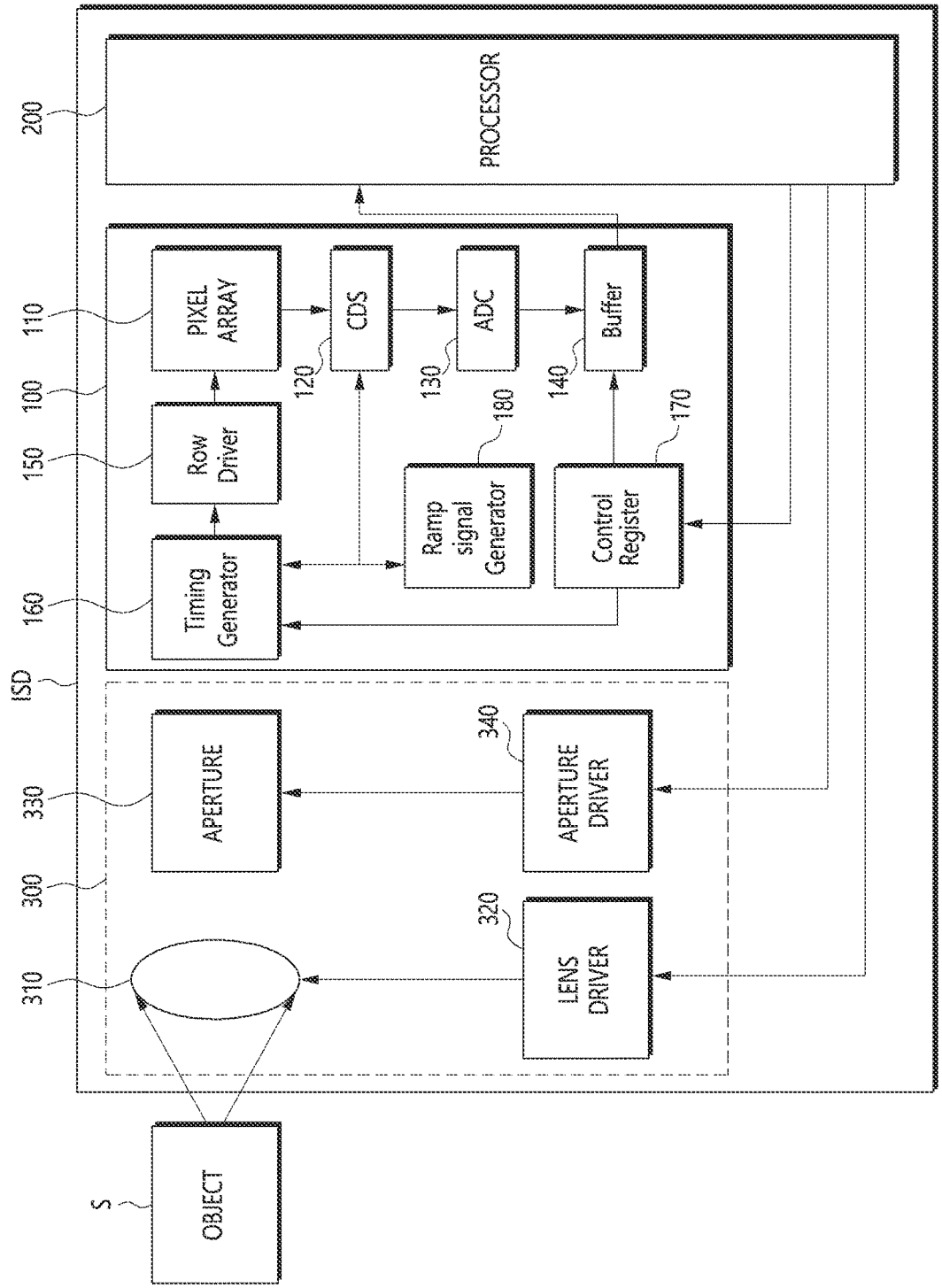
FIG. 1 is a diagram illustrating an example of an image sensing device based on an embodiment of the disclosed technology.

FIG. 1 is a diagram illustrating an example of an image sensing device based on an embodiment of the disclosed technology. Hereafter, a method in which the image sensing device performs the PDAF function and a method in which the image sensing device performs the one-shot HDR imaging function will be described with reference to FIG. 1.

As illustrated in FIG. 1, an image sensing device ISD based on an embodiment of the disclosed technology may include an image sensor 100, a processor 200 and an imaging unit 300.

The imaging unit 300 may include a component for receiving light. In some implementations, the imaging unit 300 may include a module lens 310, a lens driver 320, an aperture 330 and an aperture driver 340. In one example, the module lens 310 may include a plurality of lenses. In another example, the module lens 310 may include a single lens. The lens driver 320 may adjust the position of the module lens 310 based on a control signal of the processor 200. In some implementations, the position of the module lens 310 can be adjusted in a way that the distance between the module lens 310 and an object S is adjusted. The aperture 330 may be used to adjust the amount of light entering the module lens 310 based on the control signal of the aperture driver 340. Changes in the amount of light entering the module lens 310 through the aperture 330 may result in changes in the magnitude of a signal generated by the image sensor 100.

The processor 200 may provide the lens driver 320 with a control signal for adjusting the position of the module lens 310 or provide the aperture driver 340 with a control signal for adjusting the value of the aperture 330, based on the signal generated by the image sensor 100.

The image sensor 100 may include a pixel array 110, a CDS (Corrected Double Sampler) 120, an ADC (Analog-Digital Converter) 130, a buffer 140, a row driver 150, a timing generator 160, a control register 170 and a ramp signal generator 180.

In some embodiments of the disclosed technology, the pixel array 110 may include one or more pixel-groups. Each of the pixel groups may include a plurality of unit pixels. For example, a pixel group may include four unit-pixels arranged in a 2×2 matrix. Light rays having passed through the module lens 310 and the aperture 330 are incident on the pixel array 110 and converted into an electrical signal, and the unit pixels may generate electrical signals (pixel signals) corresponding to the object S. The unit pixels included in the pixel array 110 may generate an electrical current by absorbing photons of light, and the electrical current is provided to the CDS 120.

In some implementations, although not illustrated, each of the unit pixels included in the pixel array 110 may include microlenses, optical filters, photoelectric conversion elements (e.g., photodiodes) and interconnection layers. The microlens may focus and concentrate light onto the optical filter and the photoelectric conversion element of the pixel array 110. The optical filter may selectively transmit the incident light having passed through the microlens at certain wavelengths. The photoelectric conversion element may generate photoelectric charges corresponding to the incident light having passed through the microlens and the optical filter. Examples of the photoelectric conversion element may include a photodiode, a phototransistor, a photo gate, a pinned photodiode (PPD) or combinations thereof. In the following descriptions, the term "photoelectric conversion element" is used to indicate a photodiode. In some implementations, the photoelectric conversion element may include an N-type impurity region and a P-type impurity region that are vertically stacked. The photoelectric conversion element may be formed in a semiconductor substrate. For example, the semiconductor substrate may be a P-type semiconductor substrate.

The interconnection layer may be formed under the photoelectric conversion element. The interconnection layer may include a reset transistor, a transmission transistor, a floating diffusion, a driving transistor, a selection transistor and others. The reset transistor may be activated in response to a reset signal, and reset the voltage of the unit pixel to a predetermined level (e.g., pixel voltage level). When the reset transistor is activated, the transmission transistor may be activated, resetting the floating diffusion. The transmission transistor may be activated in response to a transmission signal, and transmit electric charges that are accumulated in the photoelectric conversion element of each of the unit pixels, to the floating diffusion. The floating diffusion may receive the electric charges generated by the photoelectric conversion element, and convert the received electric charges into a voltage accumulated electric charges. The driving transistor may have a drain to receive a pixel voltage, and the floating diffusion may be coupled to a gate of the driving transistor. The selection transistor may be coupled to a source of the driving transistor. The driving transistor may output an electrical current corresponding to the voltage of the floating diffusion coupled to a gate electrode thereof, to a signal line through the selection transistor. The selection transistor may be activated in response to a selection signal applied to a gate electrode thereof, and output a signal received from the driving transistor to the signal line and to the CDS 120.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some implementations of the disclosed technology, the CDS 120 may sample and hold the electrical signal provided by the pixel array 110. The CDS 120 may sample a specific noise level and a signal level generated by the incident light, and output a level corresponding to a difference therebetween. The ADC 130 may convert an analog signal received from the CDS 120 into a digital signal and transmit the digital signal to the buffer 140. The buffer 140 may latch the received digital signal, and sequentially output the latched signal to the processor 200. The buffer 140 may include a memory for holding a digital signal and a sense amplifier for amplifying the digital signal. The row driver 150 may activate a plurality of unit pixels included in the pixel array 110, based on a signal of the timing generator 160. For example, the row driver 150 may generate a signal for selecting one row line among the plurality of row lines. Furthermore, the row driver 150 may generate signals for activating the transistors included in the unit pixels. For example, the signals may include a transmission transistor driving signal, a reset transistor driving signal, a selection transistor driving signal and others. The timing generator 160 may control the pixel array 110 to accumulate electric charges that are generated by absorbing light or temporarily store the accumulated electric charges, and control the row driver 150 to output an electrical signal based on the stored electric charges outside the pixel array 110. The timing generator 160 may control the CDS 120 to sample and hold the electrical signal provided by the pixel array 110. The control register 170 may generate a control signal for controlling the buffer 140, the timing generator 160 and the ramp signal generator 180, based on the signal received from the processor 200. The ramp signal generator 180 may provide a reference signal for controlling the ADC 130 to detect a signal, under control of the timing generator 160.

The processor 200 may receive an output signal of the buffer 140, and generate image data or phase difference data. As described above, the processor 200 may provide a control signal for the aperture driver 340 using the generated image data. Furthermore, the processor 200 may provide a control signal for the lens driver 320 using the phase difference data.

In a first mode, the processor 200 receives the output signal of the buffer 140 and generates the phase difference data for the object S by using pixel signals generated by two or more unit pixels selected among the plurality of unit pixels included in the pixel group.

The processor 200 may generate first phase data for the object S based on pixel signals generated by pixels located on the left and right sides of the center of the pixel group. The first phase data may include a phase difference in a horizontal direction. Furthermore, the processor 200 may generate second phase data for the object S based on pixel signals generated by pixels located on the top and bottom sides of the center of the pixel group. The second phase data may include a phase difference in a vertical direction. Furthermore, the processor 200 may generate third phase data for the object S based on pixel signals generated by pixels located on the left top and right bottom of the center of the pixel group or pixels located at the right top and left bottom of the center of the pixel group. That is, the third phase data may include a phase difference in a diagonal direction. The diagonal direction may indicate a direction with a predetermined slope between the vertical direction or the horizontal direction. For example, the diagonal direction may indicate a direction with a slope of ±45° between the vertical direction or the horizontal direction.

When the distance between the module lens 310 and the object S corresponds to an in-focus position, incident light rays arriving at the respective unit pixels through one microlens may have the same magnitude. Therefore, pixel signals detected through the unit pixels sharing one microlens may have the same magnitude. Thus, when the distance between the module lens 310 and the object S corresponds to the in-focus position, the first to third phase data generated by the processor 200 may be the same. However, when the distance between the module lens 310 and the object S does not correspond to the in-focus position, incident light rays arriving at the respective unit pixels through one microlens may have different magnitudes. This is because a path difference may occur between the incident light rays passing through the microlens. Therefore, pixel signals detected through the unit pixels sharing one microlens may have different magnitudes. Thus, the first to third phase data generated from the different signals may also be different and may have different phases.

When the distance between the module lens 310 and the object S does not correspond to the in-focus position, the processor 200 may generate phase difference data by calculating the phase differences among the first to third phase data. The processor 200 may generate phase difference data using signals, and provide a control signal for the lens driver 320 based on the phase difference data, thereby adjusting the distance between the object S and the module lens 310 and the distance between the pixel array 110 and the module lens 310.

The image data may be generated in response to light incident on the image sensor 100 from the object S, and used as a control signal for adjusting the value of the aperture 330. The processor 200 may acquire a high dynamic range (HDR) image by performing an operation on the image data acquired from a plurality of unit pixels. Specifically, the processor 200 may receive an output signal of the buffer 140 and generate image data. In a second mode, the processor 200 receives an output signal of the buffer 140 and generates image data. The processor 200 may generate a plurality of pieces of image data for the object S by using the pixel signals generated by the respective unit pixels included in the pixel group. During the second mode, the processor 200 may generate image data using pixel signals generated through two or more unit-pixels sharing one microlens. When the processor 200 generates a plurality of pieces of image data using pixel signals generated through the respective unit pixels included in a single pixel group, the plurality of pieces of image data may be image data corresponding to different illumination environments. Therefore, the processor 200 may generate an HDR image by synthesizing a plurality of pieces of image data or performing an operation on the plurality of pieces of image data.

In addition to the image generation process, the processor 200 may perform image signal processing for image quality improvement, such as noise correction for image information or interpolation between adjacent pixels. FIG. 1 illustrates that the processor 200 is provided outside the image sensor 100. However, the disclosed technology is not limited thereto. As another example, the processor 200 may be provided inside the image sensor 100, or separately provided outside the image sensing device ISD.

As will be discussed below with reference to FIGS. 2 and 3, a pixel group may perform the one-shot HDR imaging function and the PDAF function in the vertical, horizontal and diagonal directions at the same time. The pixel group may include four unit-pixels arranged in a 2×2 matrix. In the following descriptions, first and second directions D1 and D2 may indicate directions crossing each other. For example, in an XY coordinate system, the first direction D1 may be set to an X-axis direction, and the second direction D2 may be set to a Y-axis direction.

Figure 2:
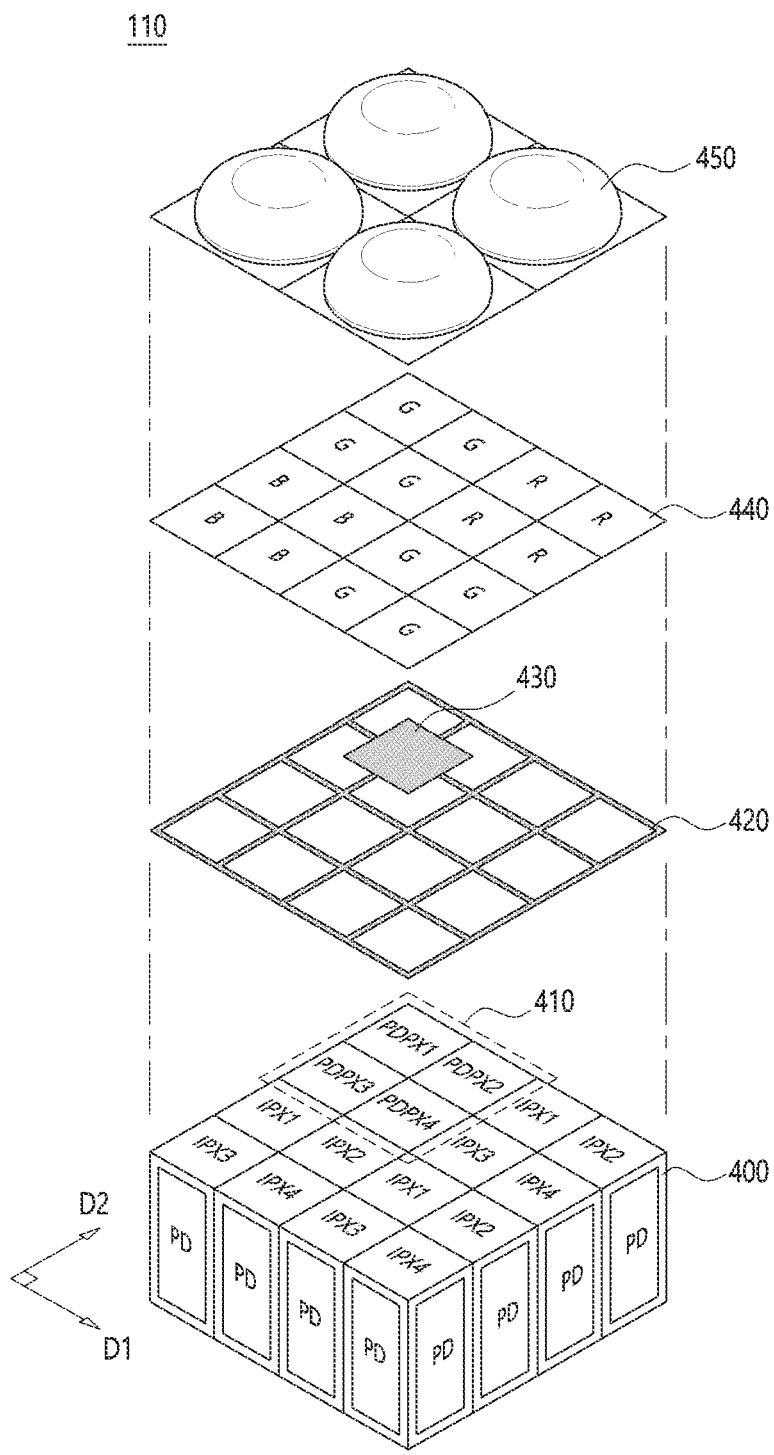
FIG. 2 is a perspective view illustrating a portion of a pixel array in the image sensing device based on some embodiments of the disclosed technology.

FIG. 2 is a perspective view illustrating a portion of the pixel array in the image sensing device based on some embodiments of the disclosed technology. FIG. 3 is a plan view illustrating a phase difference detection pixel group in the image sensing device based on some embodiments of the disclosed technology. For reference, the illustration of a grid pattern is omitted from FIG. 3, in order to more clearly describe the shape of a light shielding pattern.

Figure 3:
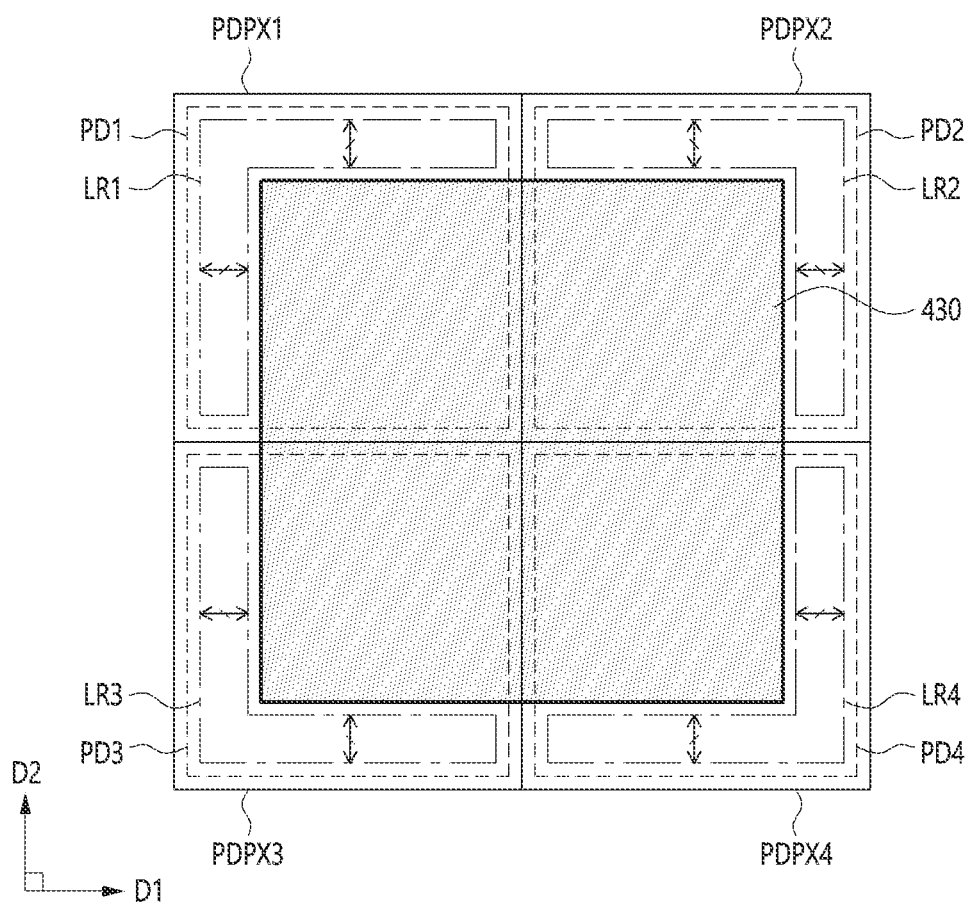
FIG. 3 is a plan view illustrating a phase difference detection pixel group in the image sensing device based on some embodiments of the disclosed technology.

As illustrated in FIGS. 2 and 3, the pixel array 110 (see FIG. 1) may include a plurality of unit pixels arranged in a matrix. The plurality of unit pixels may include a plurality of phase difference detection pixels PDPX and image detection pixels IPX. That is, the plurality of phase difference detection pixels PDPX and image detection pixels IPX may be arranged in a matrix. In some implementations, four phase difference detection pixels PDPX1 to PDPX4 may constitute one phase difference detection pixel group 410, and the pixel array 110 may include one or more phase difference detection pixel groups 410. Similarly, the four image detection pixels IPX1 to IPX4 may constitute one image detection pixel group, and the pixel array 110 may include a plurality of image detection pixel groups.

The phase difference detection pixel group 410 may include photoelectric conversion elements PD, an optical filter layer 440 including different color filters, a microlens layer 450 that includes one or more microlenses, a light shielding pattern 430 and a grid pattern 420. The photoelectric conversion elements PD may be formed in a substrate 400 at locations corresponding to the first to fourth phase difference detection pixels PDPX1 to PDPX4, respectively. The optical filter layer 440 may be formed on the substrate 400, and the one or more microlenses 450 may be formed on or over the optical filter layer 440. The light shielding pattern 430 may limit light receiving regions LR1 to LR4 of the first to fourth phase difference detection pixels PDPX1 to PDPX4, and the grid pattern 420 may extend from the light shielding pattern 430 and along the boundaries between the respective phase difference detection pixels PDPX1 to PDPX4.

The components of each of the image detection pixel groups except the light shielding pattern 430 may be formed in the same manner as those of the phase difference detection pixel group 410.

The photoelectric conversion element PD may serve to generate photocharges corresponding to incident light having passed through the microlens layer 450 and the optical filter layer 440. Examples of the photoelectric conversion element PD may include a photodiode, a phototransistor, a photogate, a PPD or combinations thereof. For example, the photoelectric conversion element PD may be a photodiode. The photodiode may include an N-type impurity region and a P-type impurity region that are stacked in a vertical direction.

The optical filter layer 440 may include different color filters where a color filter is placed above a pixel to filter the light received by that pixel. Such an optical filter layer 440 may be structured to capture color information in images and the spatial arrangement of the different color filters is designed to filter incident light using different color filters in adjacent pixels to capture color information of a scene or object to be imaged. One of suitable color filter arrangement is a Bayer color filter array of different color filters that include 50% of the total color filters to be green (G), 25% of the total color filters to be blue (B) and 25% of the total color filters to be red (R). One of different implementations of a Bayer color filter array for placing adjacent color filters of the same color in a row or column is a Quad-Bayer pixel structure, in which adjacent 2×2 pixels of a 4-pixel block are of the same color as a basic building block while achieving the Bayer color arrangement by having 50% of the total 4-pixel color filter blocks to be green (G), 25% of the total 4-pixel color filter blocks to be blue (B) and 25% of the total 4-pixel color filter blocks to be red (R). The example in FIG. 2 shows one example of such a Quad-Bayer pixel structure to include a 4×4 4-pixel block pattern of one 4-pixel block of blue color filters, one 4-pixel block of red color filters, and two 4-pixel blocks of green color filters.

The first to fourth phase difference detection pixels PDPX1 to PDPX4 may generate pixel signals in response to incident light rays at the same wavelength band. That is, the first to fourth phase difference detection pixels PDPX1 to PDPX4 may include color filters having the same color, respectively. In one example, each of the first to fourth phase difference detection pixels PDPX1 to PDPX4 includes a green color filter. However, the disclosed technology is not limited thereto. As another example, each of the first to fourth phase difference detection pixels PDPX1 to PDPX4 may include any one selected from the group consisting of a red color filter, a blue color filter, an IR filter and a white filter. The white filter may indicate a filter that allows the incident light to pass without filtering a specific wavelength band.

In some implementations, the first to fourth phase difference detection pixels PDPX1 to PDPX4 may share one microlens 450. As another example, the phase difference detection pixel group 410 may include two or more microlenses 450. In some implementations, the phase difference detection pixel group 410 may include two microlenses 450 each having an elliptical planar shape, and the first phase difference detection pixel PDPX1 and the second or third phase difference detection pixel PDPX2 or PDPX3 adjacent to the first phase difference detection pixel PDPX1 may share one microlens 450, and the other phase difference detection pixels PDPX may share the other microlens 450. In other implementations, the phase difference detection pixel group 410 may include four microlenses 450 each having a circular or rectangular planar shape, and the four microlenses 450 may be arranged to correspond to the first to fourth phase difference detection pixels PDPX1 to PDPX4, respectively.

In some implementations, the light shielding pattern 430 and the grid pattern 420 may be located between the substrate 400 and the optical filter layer 440. As another example, the light shielding pattern 430 and the grid pattern 420 may be located between the optical filter layer 440 and the microlens layer 450. The light shielding pattern 430 and the grid pattern 420 may include a material capable of blocking, absorbing or reflecting incident light, such as a metallic material. The grid pattern 420 may serve to prevent optical cross-talk between adjacent pixels.

The light shielding pattern 430 may serve to define the light receiving regions LR1 to LR4 of the first to fourth phase difference detection pixels PDPX1 to PDPX4, and may be located at the center of the phase difference detection pixel group 410. Therefore, the phase difference detection pixel group 410 may include one light shielding pattern 430, and the light shielding pattern 430 may overlap all of the first to fourth phase difference detection pixels PDPX1 to PDPX4. In other words, the light shielding pattern 430 may be formed as a single pattern which overlaps portions of the photoelectric conversion elements PD of two or more phase difference detection pixels PDPX. Here, the overlapping areas between the light shielding pattern 430 and the respective first to fourth phase difference detection pixels PDPX1 to PDPX4 may be equal to one another.

In order for the phase difference detection pixel group 410 to perform the PDAF function in the vertical, horizontal and diagonal directions, the light shielding pattern 430 shields two or more phase difference detection pixels PDPX, and light receiving regions LR surrounding the light shielding pattern 430 allows a limited amount of light to pass through and enter the two or more phase difference detection pixels PDPX. Each of the light receiving region LR may include an L-shaped structure. In some implementations, each of the light receiving regions may include a plurality of L-shaped opening. In one example, each of the light receiving regions LR may include a first region and a second region. The first region may extend in the first direction D1, and the second region may extend in the second direction D2. In some implementations, the width of the first region in the second direction may be equal to the width of the second region in the first direction. In some implementations, the light shielding pattern 430 may have a rectangular planar shape surrounded by four light receiving regions LR, each of which has an L-shaped structure.

In some implementations, the first to fourth phase difference detection pixels PDPX1 to PDPX4 of the phase difference detection pixel group 410 may include the first to fourth light receiving regions LR1 to LR4, respectively, each of which has an L-shaped structure with the light shielding pattern 430 located in the center of the phase difference detection pixel group 410. The light shielding pattern 430 covers the center of the phase difference detection pixel group 410 of four phase difference detection pixels, leaving edge regions of the phase difference detection pixel group 410 as the light receiving regions LR1 to LR4. In some implementations, each of the light receiving regions LR1 to LR4 has an L-shape, and the light receiving regions LR1 to LR4 are arranged such that the light shielding pattern 430 is surrounded by the light receiving regions LR1 to LR4. In one example, the first and second light receiving regions LR1 and LR2 may be symmetrical about the second direction D2, and the third and fourth light receiving regions LR3 and LR4 may be symmetrical with each other in the second direction D2. The first and third light receiving regions LR1 and LR3 may be symmetrical about the first direction D1, and the second and fourth light receiving regions LR2 and LR4 may be symmetrical about the first direction D1. The first to fourth light receiving regions LR1 to LR4 may have substantially the same area. In some implementations, the first to fourth light receiving regions LR1 to LR4 may be symmetrical about the center of the phase difference detection pixel group 410 such that each of the first to fourth light receiving regions LR1 to LR4 has substantially the same light receiving area.

In order to detect a phase difference in the horizontal direction or the first direction D1, the phase difference detection pixel group 410 may generate data of phase difference in the first direction D1 by comparing the sum of the pixel signals generated by the first and third phase difference detection pixels PDPX1 and PDPX3 to the sum of the pixel signals generated by the second and fourth phase difference detection pixels PDPX2 and PDPX4. In order to detect a phase difference in the vertical direction or the second direction D2, the phase difference detection pixel group 410 may generate data of phase difference in the second direction D2 by comparing the sum of the pixel signals generated by the first and second phase difference detection pixels PDPX1 and PDPX2 to the sum of the pixel signals generated by the third and fourth phase difference detection pixels PDPX3 and PDPX4. Furthermore, in order to detect a phase difference in the diagonal direction, the phase difference detection pixel group 410 may generate data of phase difference in the diagonal direction by comparing the pixel signal generated by the first phase difference detection pixel PDPX1 to the pixel signal generated by the fourth phase difference detection pixel PDPX4, or comparing the pixel signal generated by the second phase difference detection pixel PDPX2 to the pixel signal generated by the third phase difference detection pixel PDPX3.

The disclosed technology can be implemented in some embodiments to provide a phase difference detection pixel group 410 that may also generate HDR image data by performing an operation on the pixel signals generated by the first to fourth phase difference detection pixels PDPX1 to PDPX4.

As described above, the first to fourth phase difference detection pixels PDPX1 to PDPX4 of the phase difference detection pixel group 410 based on some embodiments of the disclosed technology may include the first to fourth light receiving regions LR1 to LR4, respectively, such that the light shielding pattern 430 is surrounded by the first to fourth light receiving regions LR1 to LR4. The pixel signals generated by a single phase-difference detection pixel group 410 can be processed to obtain an HDR image. Therefore, the phase difference detection pixel group 410 implemented based on some embodiments of the disclosed technology can perform the one-shot HDR imaging function and the PDAF function in the horizontal direction, the vertical direction and the diagonal direction at the same time.

FIGS. 4A to 4D are plan views illustrating modified examples of the phase difference detection pixel group 410 in the image sensing device based on some embodiments of the disclosed technology. Phase difference detection pixel groups 411 to 414, which will be described below with reference to FIGS. 4A to 4D, may perform the PDAF function and the one-shot HDR imaging function at the same time, and generate a more enhanced HDR image. In order to more clearly illustrate the shape of the light shielding pattern, a grid pattern is omitted from FIGS. 4A to 4D.

As illustrated in FIGS. 4A to 4D, each of the phase difference detection pixel groups 411 to 414 based on other example implementations may include first to fourth light receiving regions LR1 to LR4 that have L-shaped structures with various widths. Since the phase difference detection pixels PDPX in one phase difference detection pixel group have different light receiving areas, it is possible to generate a more enhanced HDR image.

Figure 4A:
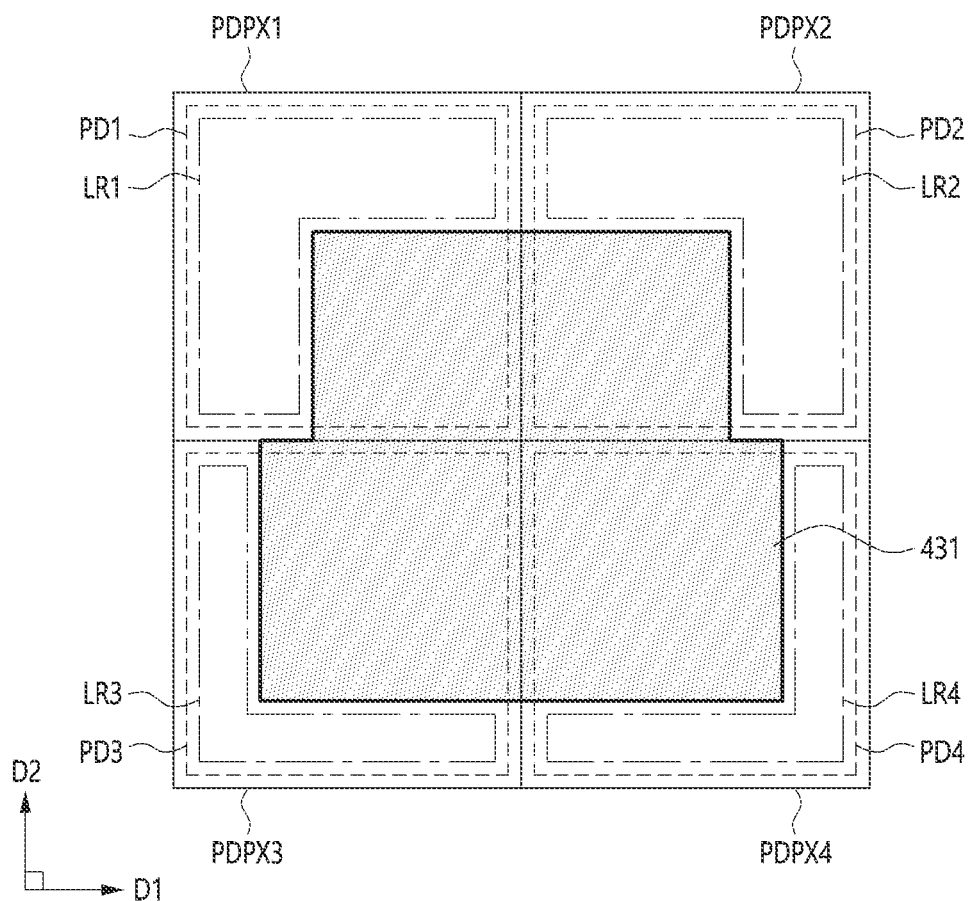
FIGS. 4A to 4D are plan views illustrating examples of the phase difference detection pixel group in the image sensing device based on some embodiments of the disclosed technology.

As illustrated in FIG. 4A, the first light receiving region LR1 of the phase difference detection pixel group 411 may be symmetrical with any one of the second to fourth light receiving regions LR2 to LR4 with respect to a light shielding pattern 431. Furthermore, the first light receiving region LR1 may have substantially the same light receiving area as any one of the second to fourth light receiving regions LR2 to LR4 that is symmetrical with the first light receiving region LR1.

In some implementations, in the phase difference detection pixel group 411, the area of the first light receiving region LR1 and the area of the second light receiving region LR2 may be equal to each other, and the area of the third light receiving region LR3 and the area of the fourth light receiving region LR4 may be equal to each other. Here, the area of the first light receiving region LR1 may be larger than the area of the third light receiving region LR3. The first and second light receiving regions LR1 and LR2 may be symmetrical about the second direction D2, and the third and fourth light receiving regions LR3 and LR4 may be symmetrical about the second direction D2.

Figure 4B:
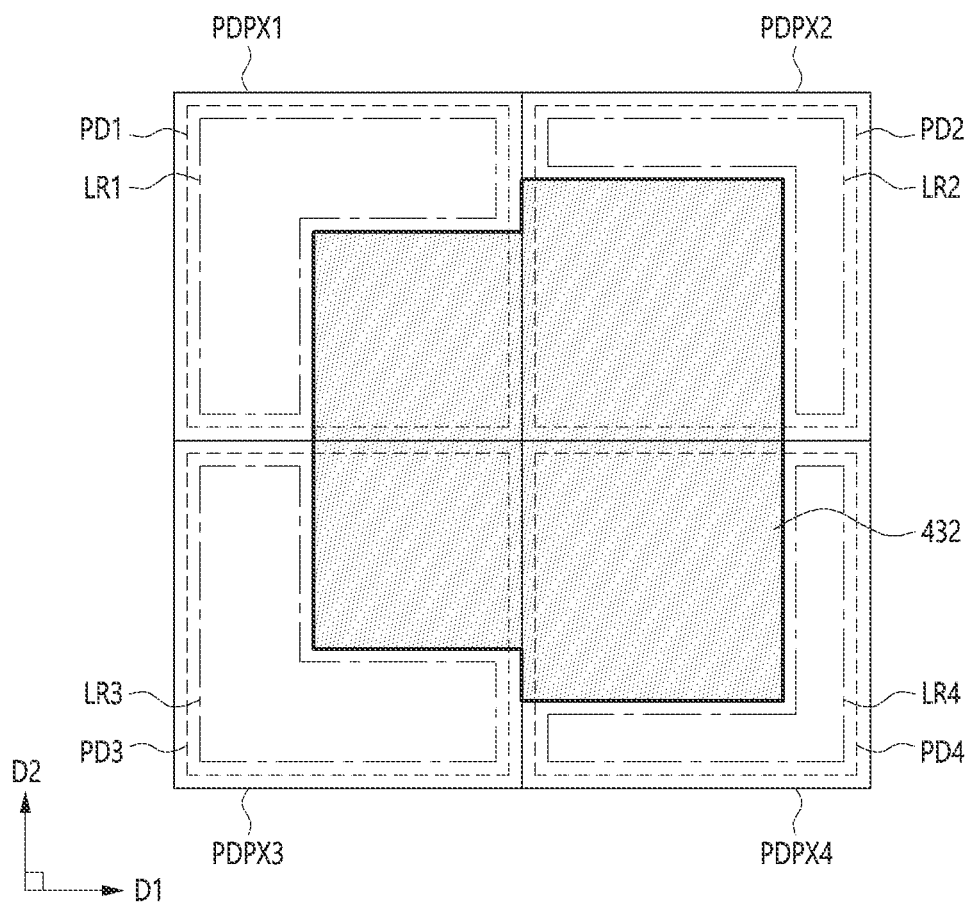

As illustrated in FIG. 4B, the first light receiving region LR1 of the phase difference detection pixel group 412 may be symmetrical with any one of the second to fourth light receiving regions LR2 to LR4 with respect to a light shielding pattern 432. Furthermore, the first light receiving region LR1 may have substantially the same light receiving area as any one of the second to fourth light receiving regions LR2 to LR4 that is symmetrical with the first light receiving region LR1.

In some implementations, in the phase difference detection pixel group 412, the area of the first light receiving region LR1 and the area of the third light receiving region LR3 may be equal to each other, and the area of the second light receiving region LR2 and the area of the fourth light receiving region LR4 may be equal to each other. Here, the area of the first light receiving region LR1 may be larger than the area of the second light receiving region LR2. The first and third light receiving regions LR1 and LR3 may be symmetrical about the first direction D1, and the second and fourth light receiving regions LR2 and LR4 may be symmetrical about the first direction D1.

Figure 4C:
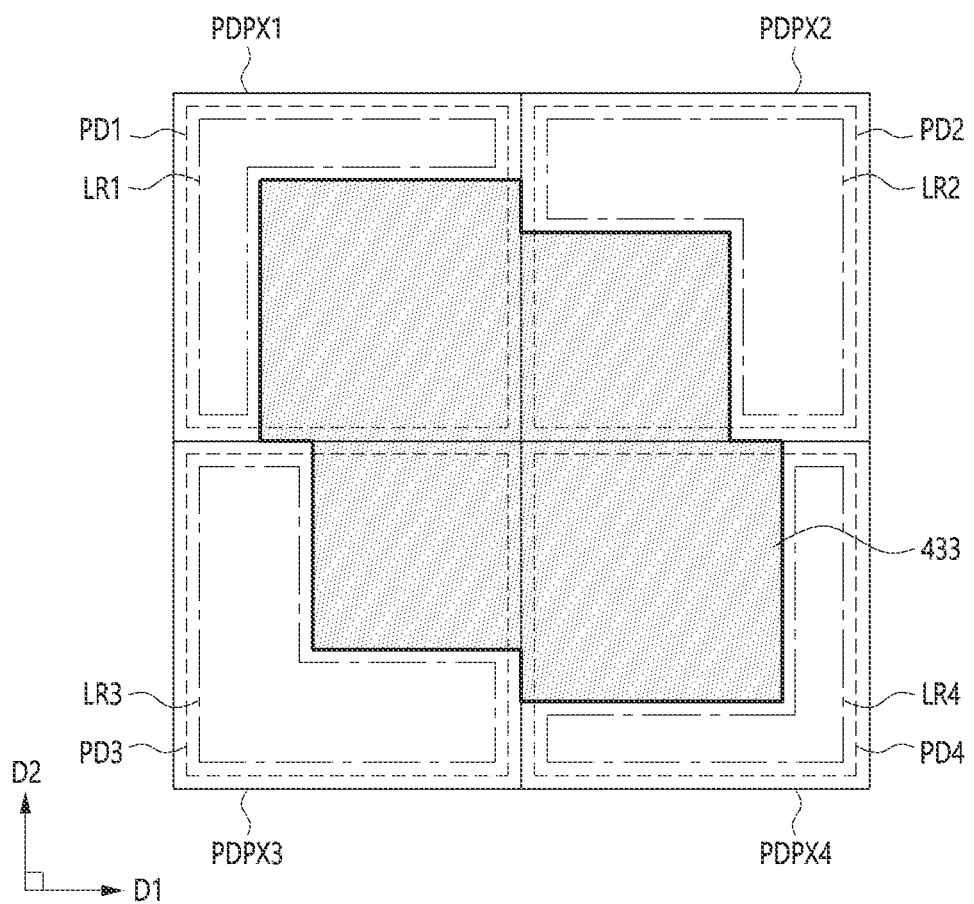

As illustrated in FIG. 4C, the first light receiving region LR1 of the phase difference detection pixel group 413 may be symmetrical with any one of the second to fourth light receiving regions LR2 to LR4 with respect to a light shielding pattern 433. Furthermore, the first light receiving region LR1 may have substantially the same light receiving area as any one of the second to fourth light receiving regions LR2 to LR4 that is symmetrical with the first light receiving region LR1.

In some implementations, in the phase difference detection pixel group 413, the area of the first light receiving region LR1 and the area of the fourth light receiving region LR4 may be equal to each other, and the area of the second light receiving region LR2 and the area of the third light receiving region LR3 may be equal to each other. Here, the area of the second light receiving region LR2 may be larger than the area of the first light receiving region LR1. The first and fourth light receiving regions LR1 and LR4 facing each other in a first diagonal direction may be symmetrical about the center of the phase difference detection pixel group 413, and the second and third light receiving regions LR2 and LR3 facing each other in a second diagonal direction crossing the first diagonal direction may be symmetrical about the center of the phase difference detection pixel group 413.

Figure 4D:
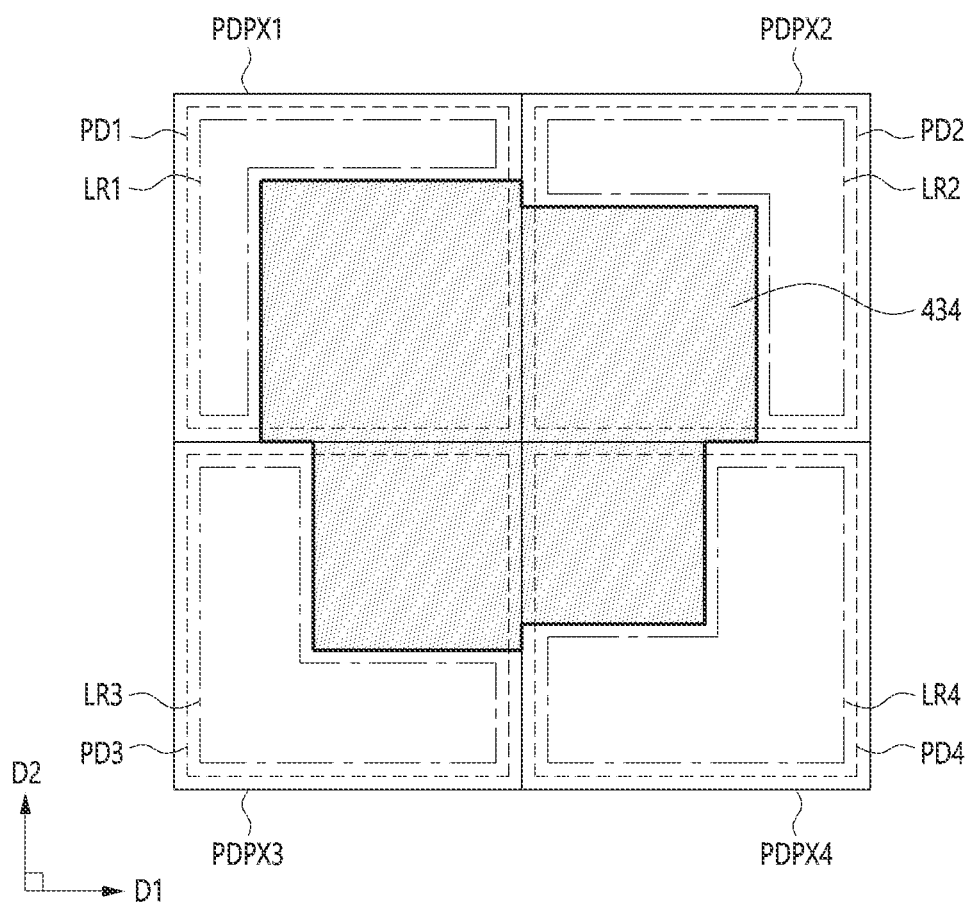

As illustrated in FIG. 4D, the first to fourth light receiving regions LR1 to LR4 of the phase difference detection pixel group 414 may have different widths and areas while surrounding a light shielding pattern 434.

In some implementations, in the phase difference detection pixel group 414, the first light receiving region LR1 may have the smallest area, and the fourth light receiving region LR4 may have the largest area. Here, the area of the second light receiving region LR2 may be larger than the area of the first light receiving region LR1, and the area of the third light receiving region LR3 may be larger than the area of the second light receiving region LR2.

As described above, the first to fourth phase difference detection pixels PDPX1 to PDPX4 of each of the phase difference detection pixel groups 411 to 414 based on the modified examples may include the first to fourth light receiving regions LR1 to LR4, respectively, each of which has an L-shaped structure with the light shielding pattern 431 to 434 located in the center of the phase difference detection pixel group 410. The pixel signals generated by a single phase-difference detection pixel group 411, 412, 413 or 414 can be processed to obtain an HDR image. Therefore, the phase-difference detection pixel group 411, 412, 413 or 414 implemented based on some embodiments of the disclosed technology can perform the PDAF function in the horizontal direction, the vertical direction and the diagonal direction and the one-shot HDR imaging function at the same time. Furthermore, the first to fourth light receiving regions LR1 to LR4 may be formed to have different light receiving areas, thereby acquiring a more enhanced HDR image.

In some embodiments of the disclosed technology, each of the phase difference detection pixel groups 410 to 414 includes four unit pixels arranged in a 2×2 matrix. In other embodiments of the disclosed technology, the pixel array 110 (see FIG. 1) may include sub pixel arrays each having a plurality of unit pixels arranged in a 3×3 or 4×4 matrix and configured to generate pixel signals in response to incident light rays at the same wavelength band, and the phase difference detection pixel groups 410 to 414 based on some embodiments of the disclosed may be arranged in each of the sub pixel arrays. Here, the phase difference detection pixel groups 410 to 414 in each of the sub pixel arrays may be arranged at the same positions or different positions.

As will be discussed below with reference to FIG. 5, a pixel group that includes nine unit-pixels arranged in a 3×3 matrix can perform the one-shot HDR imaging function and the PDAF function in vertical, horizontal and diagonal directions at the same time. In order to more clearly illustrate the shape of a light shielding pattern, a grid pattern is omitted from FIG. 5.

Figure 5:
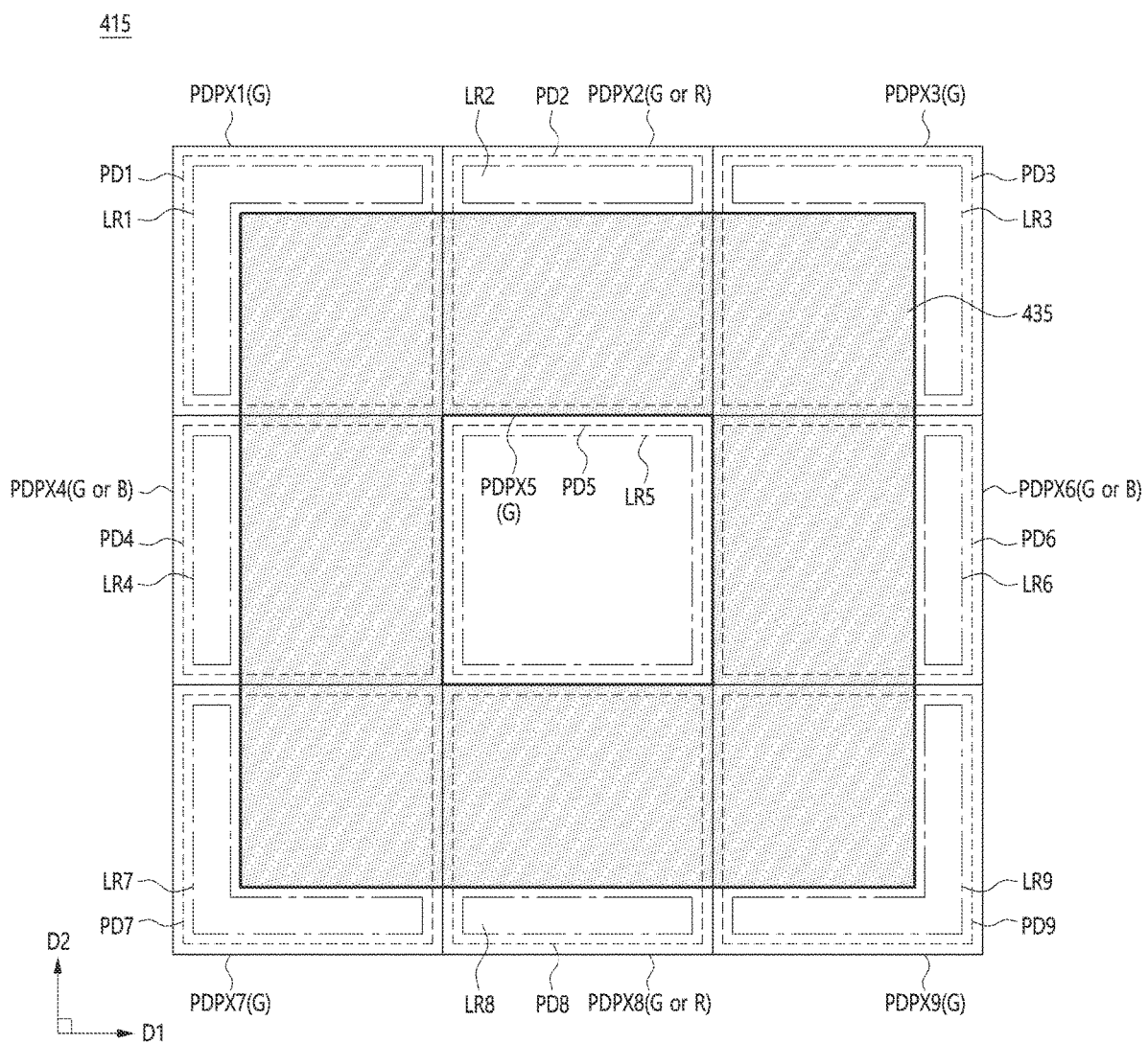
FIG. 5 is a plan view illustrating an example of a phase difference detection pixel group in an image sensing device based on an embodiment of the disclosed technology.

FIG. 5 is a plan view illustrating an example of a phase difference detection pixel group in an image sensing device based on an embodiment of the disclosed technology.

In some implementations, a phase difference detection pixel group 415 may include photoelectric conversion elements PD1 to PD9, an optical filter (not illustrated), one or more microlenses (not illustrated), a light shielding pattern 435 and a grid pattern (not illustrated). The photoelectric conversion elements PD1 to PD9 may be formed in a substrate (not illustrated) at locations corresponding to first to ninth phase difference detection pixels PDPX1 to PDPX9, respectively. The optical filter may be formed on the substrate, and the one or more microlenses may be formed on the optical filter. The light shielding pattern 435 may limit light receiving regions LR of the first to ninth phase difference detection pixels PDPX1 to PDPX9, and the grid pattern may extend from the light shielding pattern 435 and along the boundaries between the respective phase difference detection pixels PDPX.

In order for the phase difference detection pixel group 415 to perform the PDAF function in the horizontal, vertical and diagonal directions, the light shielding pattern 435 may include a light receiving region LR structured to shield at least part of two or more phase difference detection pixels PDPX A light receiving region LR may be structured to allow a limited amount of light to pass through and enter the phase difference detection pixel group 415. In some implementations, the light receiving region LR may include one or more L-shaped structures and/or one or more I-shaped or linear structures.

In some implementations, the phase difference detection pixel group 415 may include a first phase difference detection pixel PDPX1, a third phase difference detection pixel PDPX3, a seventh phase difference detection pixel PDPX7 and a ninth phase difference detection pixel PDPX9, which are located at the respective corners of the phase difference detection pixel group 415 due to the light shielding pattern 435 and include a first light receiving region LR1, a third light receiving region LR3, a seventh light receiving region LR7 and a ninth light receiving region LR9, respectively, each of which has an L-shaped structure. Furthermore, the first and third light receiving regions LR1 and LR3 may be symmetrical about the second direction D2, and the seventh and ninth light receiving regions LR7 and LR9 may be symmetrical about the second direction D2. Furthermore, the first and seventh light receiving regions LR1 and LR7 may be symmetrical about the first direction D1, and the third and ninth light receiving regions LR3 and LR9 may be symmetrical about the first direction D1. The first, third, seventh and ninth light receiving regions LR1, LR3, LR7 and LR9 may have substantially the same area. In other words, the first, third, seventh and ninth light receiving regions LR1, LR3, LR7 and LR9 may be symmetrical with one another, and thus have substantially the same light receiving area.

The first, third, seventh and ninth phase difference detection pixels PDPX1, PDPX3, PDPX7 and PDPX9 may generate pixel signals in response to incident light rays at the same wavelength band. For example, the first, third, seventh and ninth phase difference detection pixels PDPX1, PDPX3, PDPX7 and PDPX9 may include the same color filters, for example, green color filters.

Furthermore, the phase difference detection pixel group 415 may include a second phase difference detection pixel PDPX2, a fourth phase difference detection pixel PDPX4, a sixth phase difference detection pixel PDPX6 and an eighth phase difference detection pixel PDPX8, which are located between the respective corners of the phase difference detection pixel group 415 with the light shielding pattern 435 being at the center of the phase difference detection pixel group 415, and include a second light receiving region LR2, a fourth light receiving region LR4, a sixth light receiving region LR6 and an eighth light receiving region LR8, respectively, each of which has an I-shaped or linear structure. The fourth and sixth light receiving regions LR4 and LR6 may be symmetrical about the second direction D2, and the second and eighth light receiving regions LR2 and LR8 may be symmetrical about the first direction D1. The second, fourth, sixth and eighth light receiving regions LR2, LR4, LR6 and LR8 may have substantially the same area.

The second, fourth, sixth and eighth phase difference detection pixels PDPX2, PDPX4, PDPX6 and PDPX8 may generate pixel signals in response to incident light rays at the same wavelength band. For example, the second, fourth, sixth and eighth phase difference detection pixels PDPX2, PDPX4, PDPX6 and PDPX8 may include the same color filters, for example, green color filters.

The second and eighth phase difference detection pixels PDPX2 and PDPX8 facing each other in the second direction D2 may generate pixel signals in response to incident light rays at a first wavelength band, and the fourth and sixth phase difference detection pixels PDPX4 and PDPX6 facing each other in the first direction D1 may generate pixel signals in response to incident light rays at a second wavelength band. For example, the second and eighth phase difference detection pixels PDPX2 and PDPX8 may include the same color filters, for example, red color filters. On the other hand, the fourth and sixth phase difference detection pixels PDPX4 and PDPX6 may include the same color filters, for example, blue color filters.

The light shielding pattern 435 may have a ring-type planar shape as a single pattern which overlaps portions of the photoelectric conversion elements PD of the first to fourth phase difference detection pixels PDPX1 to PDPX4 and the sixth to ninth phase difference detection pixels PDPX6 to PDPX9 along the edge of the fifth phase difference detection pixel PDPX5 located in the center of the phase difference detection pixel group 415. The fifth light receiving region LR5 of the fifth phase difference detection pixel PDPX5 located in the center of the phase difference detection pixel group 415 may have the same area as the light receiving regions of the image detection pixels IPX (see FIG. 1).

While various embodiments have been described above, the embodiments described are examples only. Variations and enhancements to the disclosed embodiments and other embodiments can be made based on what is described or/and illustrated in this patent document.

What is claimed is:

1. An image sensing device, comprising:
   a pixel group including a plurality of unit pixels, each of the plurality of unit pixels including a photoelectric conversion element; and
   a light shielding pattern configured to overlap with portions of photoelectric conversion elements of selected unit pixels among the plurality of unit pixels of the pixel group without a disconnection, the light shielding pattern defining a plurality of light receiving regions of the selected unit pixels,
   wherein each of the plurality of light receiving regions of the selected unit pixels includes at least one of a first region extending in a first direction and a second region extending from the first region along a second direction forming a selected angle with the first direction, and
   wherein phase data is obtained by pixel signals of the plurality of light receiving regions located in the selected unit pixels at different positions.

2. The image sensing device according to claim 1, wherein the first direction and the second direction form a substantially 90°.

3. The image sensing device according to claim 1, wherein the plurality of unit pixels of the pixel group includes at least one phase difference detection pixel.

4. The image sensing device according to claim 1, wherein the plurality of light receiving regions of the selected unit pixels have a same area as each other.

5. The image sensing device according to claim 1, wherein the plurality of light receiving regions of the selected unit pixels have areas different from each other.

6. The image sensing device according to claim 1, wherein a line width of the first region and a line width of the second region are equal to each other.

7. The image sensing device according to claim 1, wherein a line width of the first region and a line width of the second region are different from each other.

8. The image sensing device according to claim 1, wherein the plurality of light receiving regions of the selected unit pixels are arranged symmetrically with respect to at least one of the first direction and the second direction.

9. The image sensing device according to claim 1, wherein the plurality of light receiving regions of the selected unit pixels are located at edges of the pixel group, respectively.

10. The image sensing device according to claim 1, wherein the selected unit pixels include unit pixels are arranged along edges of the pixel group.

11. The image sensing device according to claim 1, wherein the selected unit pixels correspond to all of the plurality of unit pixels of the pixel group.

12. The image sensing device according to claim 1, wherein an area of the light shielding pattern of each of the plurality of unit pixels is larger than an area of each of the plurality of light receiving regions of the selected unit pixels.

13. The image sensing device according to claim 1, wherein the plurality of unit pixels includes a first to ninth unit pixels that are arranged in a matrix, wherein one of the plurality of light receiving regions is arranged over a unit pixel corresponding to a center among the first to ninth unit pixels, and wherein the light shielding pattern is located at unit pixels other than the unit pixel corresponding to the center among the first to ninth unit pixels.

14. The image sensing device according to claim 1, wherein each of the plurality of unit pixels includes:
at least one interconnection layer including at least one transistor formed in a front side of a substrate;
a grid pattern stacked over a back side of the substrate, the grid pattern being arranged over boundaries between the plurality of unit pixels; and
an optical filter array arranged over the grid pattern, wherein the light shielding pattern extends from the grid pattern.

15. An image sensing device, comprising:
a pixel group separated into a plurality of unit pixels, each of the plurality of unit pixels including photoelectric conversion element and at least one transistor;
a grid pattern separating a plurality of optical filters so that each optical filter corresponds to a unit pixel; and
a light shielding pattern configured to be extended from the grid pattern, and arranged over selected unit pixels of the pixel group to overlap portions of photoelectric conversion elements of the selected unit pixels without a disconnection, the light shielding pattern defining a light receiving region of a selected unit pixel of the pixel group the light receiving region of the selected unit pixel includes at least one of a first region extending along a first direction and a second region extending along a second direction perpendicular to the first direction,
wherein an area of the light shielding pattern of each of the plurality of unit pixels is larger than an area of the light receiving region of each of the plurality of unit pixels.

16. The image sensing device according to claim 15, wherein the selected unit pixel includes a phase difference detection pixel.

17. An image sensing device, comprising:
a pixel group defined in a substrate, the pixel group including a plurality of unit pixels; and
a light shielding pattern arranged over the substrate to overlap set regions of the plurality of unit pixels of the pixel group and configured to define a plurality of light receiving regions arranged along an edge portion of the pixel group,
wherein an area of the light shielding pattern of each of the plurality of unit pixels is larger than an area of a light receiving region of each of the plurality of unit pixels.

18. The image sensing device according to claim 17, wherein each of the plurality of unit pixels includes:
a plurality of photo conversion elements formed in the substrate;
a grid pattern stacked over a bottom side of the substrate, the grid pattern being arranged over boundaries between the plurality of unit pixels; and
an optical filter array arranged over the grid pattern.

* * * * *